United States Patent [19]

Kaufman

[11] Patent Number: 4,829,252
[45] Date of Patent: May 9, 1989

[54] MRI SYSTEM WITH OPEN ACCESS TO PATIENT IMAGE VOLUME

[75] Inventor: Leon Kaufman, San Francisco, Calif.

[73] Assignee: The Regents of the University of California, Berkeley, Calif.

[21] Appl. No.: 113,443

[22] Filed: Oct. 28, 1987

[51] Int. Cl.$^4$ ............................................. G01R 33/20
[52] U.S. Cl. ................................. 324/309; 324/318
[58] Field of Search ............... 324/300, 307, 309, 318, 324/319, 320, 322

[56] References Cited

U.S. PATENT DOCUMENTS

| | | | |
|---|---|---|---|
| 4,534,358 | 8/1985 | Young | 324/309 |
| 4,543,959 | 10/1985 | Sepponen | 324/309 |
| 4,571,568 | 2/1986 | Grangereau | 324/320 |
| 4,629,989 | 12/1986 | Riehl | 324/318 |
| 4,634,980 | 1/1987 | Misic | 324/318 |
| 4,714,886 | 12/1987 | Halpern | 324/320 |
| 4,721,914 | 1/1988 | Fukushima | 324/320 |

OTHER PUBLICATIONS

Sanyo—SMR-15P, 7 pp.
Ashi—MR Mark-J, 5 pp.
Fonar—Fonar-4, 3 pp.

*Primary Examiner*—Michael J. Tokar
*Attorney, Agent, or Firm*—Nixon & Vanderhye

[57] ABSTRACT

An MRI system using a pair of opposed magnetic poles to create the requisite static magnetic field $H_0$ is configured so as to provide open and unobstructed patient access areas communicating directly with an MRI imaging volume along directions which are perpendicular to the patient transport axis. In this manner, operator/doctor access to the patient is maximized while potential claustrophobic reactions from the patient are minimized.

16 Claims, 4 Drawing Sheets

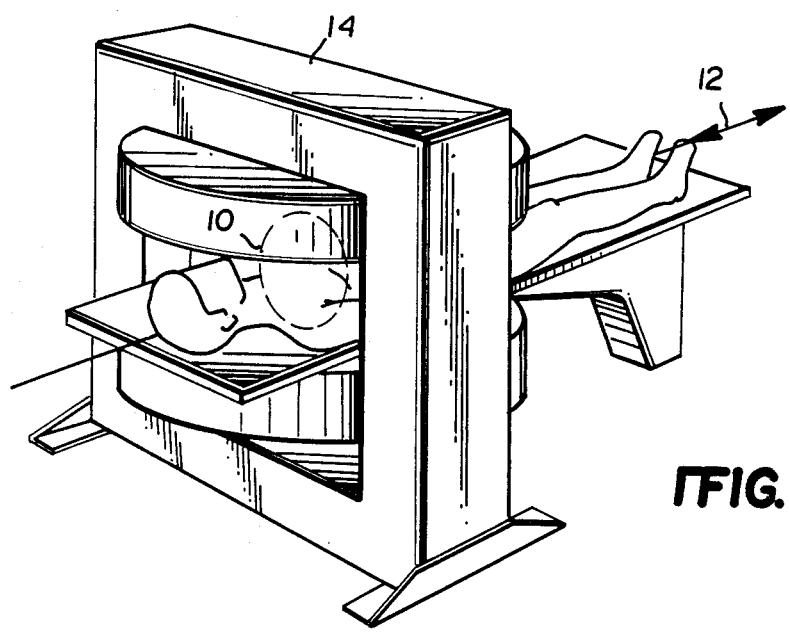
FIG. 1 (PRIOR ART)
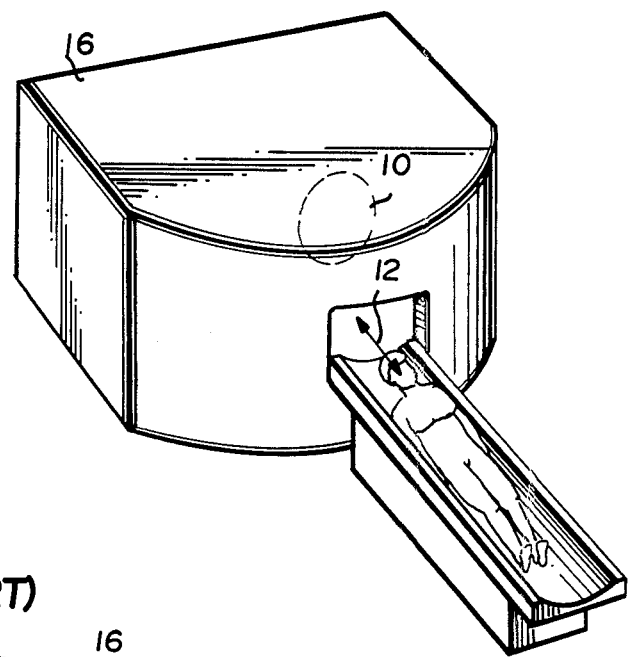
FIG. 2 (PRIOR ART)
FIG. 3 (PRIOR ART)
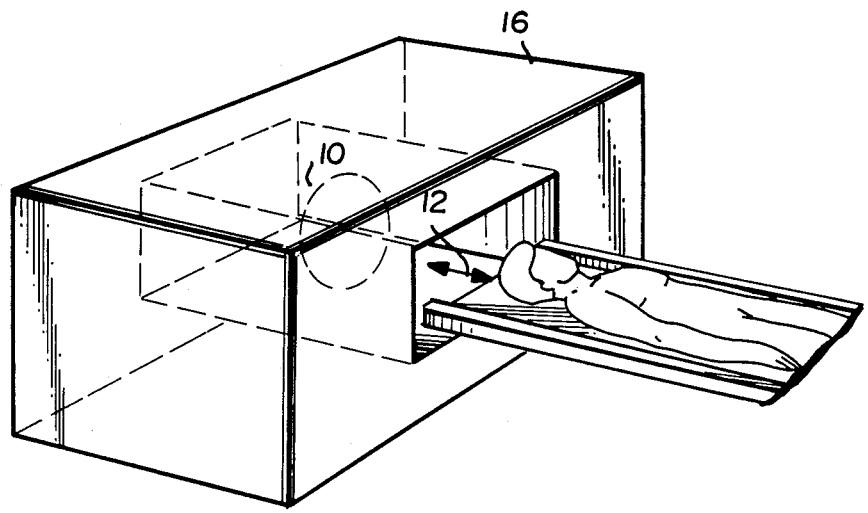

MRI SYSTEM WITH OPEN ACCESS TO PATIENT IMAGE VOLUME

This invention relates generally to magnetic resonance imaging (MRI) systems. In particular, it relates to the spatial arrangement of the (static and gradient) magnetic field generating components of an MRI system so as to maximize open and unobstructed patient access areas communicating directly with an MRI imaging volume along directions perpendicular to the patient transport axis.

The art of magnetic resonance imaging (MRI) is now well developed and several different types of MRI systems are commercially available. In all of them, some means is provided to produce a very strong static magnetic field $H_o$ and controlled spatial gradients therein (e.g., along three mutually orthogonal coordinate axes). The static magnetic field is typically of an approximately homogenous nature within a predefined imaging volume and the controlled gradients are typically approximately linear with respect to spatial displacements there-within.

A programmed sequence of radio frequency pulses is transmitted into body portions located within the imaging volume at predetermined frequency distributions so as to selectively nutate the magnetic moment of certain atoms by predetermined amounts in accordance with well-known nuclear magnetic resonance (NMR) principles. After cessation of such transmitted RF pulses, the NMR nutated atoms tend to relax back toward alignment with the static magnetic field $H_o$ and, in the process, produce characteristic NMR RF signals. Such RF signals are received, detected and processed to thereafter produce a desired MRI image of the body portion located within the imaging area in accordance with any one of many known MRI techniques as will be appreciated by those in the art. The transmitted RF pulses typically are synchronized with a special sequence of current pulses passed through various magnetic gradient coils during the imaging process so as to effect spatial information encoding processes and/or to provide known types of NMR phasing control.

In some MRI apparatus, the static magnetic field $H_o$ and/or the magnetic gradient coils are realized in the form of large solenoidal coils or, in the case of gradient coils, saddle-shaped coils conformed to a generally tubular configuration. In such cases, it is naturally necessary for patient access to the imaging volume to be provided only along a narrow tunnel through the tubular shaped apparatus. With some patients, this may give rise to claustrophobic reactions. It also makes it extremely cumbersome to access the image volume (e.g., so as to adjust the relative positioning of RF transmit and/or receive coils or to attend to patient needs).

Other types of MRI systems utilize a pair of magnetic poles (e.g., permanent magnets or electromagnetic magnets with ferromagnetic or air cores) disposed on opposite sides of the image volume to create the requisite static magnetic field $H_o$. In the past, either necessary magnetic circuits for return flux (i.e., outside the image volume) between the magnetic poles and/or the magnetic gradient coils (e.g., in a tubular form rather than flat) or decorative cover systems have been constructed so as to also limit access to the image volume except along a generally tunnel-shaped area through which the patient is transported into the image volume. Thus, as with the solenoidal field generating devices, access to the image volume has been essentially limited to only one or two open and unobstructed patient access ports or areas—i.e., the ends of the patient transport tunnel aligned with the patient transport axis.

Some typical examples of the latter type of prior art MRI system structures are depicted in FIGS. 1-3. In each case, access to the image volume 10 is limited to either a single port (FIG. 2) or a pair of aligned ports (FIGS. 1 and 3) along the patient transport axis 12. In every case, there is no open and unobstructed patient access path communicating directly with the image volume 10 in a direction perpendicular to the patient transport axis 12. Instead, any such potential access is blocked either by return magnetic flux circuit structure 14 and/or by a gradient coil, (FIG. 1) and/or by housing structure 16 (FIGS. 2 and 3). As those in the art will appreciate, behind the housing structures 16 are typically further obstructions to access in directions perpendicular to the patient transport axis 12 (e.g., magnetic flux return circuits and/or magnetic gradient coil structures or the like).

I have now discovered an improved magnetic resonance imaging apparatus wherein the static field magnet and gradient coil and decorative cover structures are configured so as to leave an open and obstructed patient access area communicating directly with the image volume along a direction perpendicular to the patient transport axis. In the preferred exemplary embodiment, such transverse access to the imaging volume may be had from two opposite sides of the patient transport mechanism while in yet another exemplary embodiment, such transverse access to the imaging volume passes virtually through the top of the MRI system. In such exemplary embodiments, magnetic flux return circuits are preferably in the form of cylindrical columns (e.g., four of them) disposed radially outwardly of the magnetic poles. In this manner, transverse unobstructed access to the imaging volume is provided not only along the patient transport axis but also through at least one additional transverse port provided between such columnar return flux circuit structures. Although the four column static magnet construction is a standard available vendor design, I have taken unique advantage of such an open static magnet structure by coordinating gradient coil and housing structures so as to maintain such "openness" in the final completed MRI structure. That is, no obstructing housings or other structures are used to obstruct such transverse access paths.

Accordingly, in the preferred exemplary embodiment of this invention, a magnetic resonance imaging apparatus includes a main static magnetic field structure for producing the requisite static magnetic field $H_o$ within a predetermined patient imaging volume through which a patient transport is arranged along a predetermined Z axis. Magnetic gradient coils associated with the main static field structure are provided for effecting controlled gradients in the static magnetic field $H_o$ along mutually orthogonal x,y,z axes within the patient imaging volume. However, the main static field structure and the gradient coils are configured so as to leave an open and unobstructed patient access area/path communicating directly with the imaging volume along a direction that is perpendicular to the patient transport z-axis.

Indeed, in the preferred exemplary embodiment, permanent magnet poles are disposed with horizontal poles planes below and above the imaging volume so as to produce a vertically oriented $H_o$ field—while magnetic flux return paths are provided through four vertical columns which also support the upper permanent magnet structure above the imaging volume. In this manner, patient transport access is provided along the z-axis into and out of the imaging volume while a pair of opposing, open and unobstructed patient access areas/paths also communicate directly and transversely with the imaging volume along directions perpendicular to the patient transport z-axis.

Stated somewhat differently, in the exemplary embodiment, there are at least three (and preferably at least four) open and unobstructed patient access areas communicating directly with the imaging volume along respective directions which are all perpendicular to the static $H_o$ field—and at least one (preferably two) of which is(are) also perpendicular to the patient transport axis z.

These as well as other objects and advantages of this invention will be more completely understood and appreciated by carefully reading the following detailed description of the presently preferred exemplary embodiments taken in conjunction with the accompanying drawings, of which:

FIGS. 1, 2 and 3 are perspective views of typical prior art arrangements for MRI apparatus;

Figure 4:
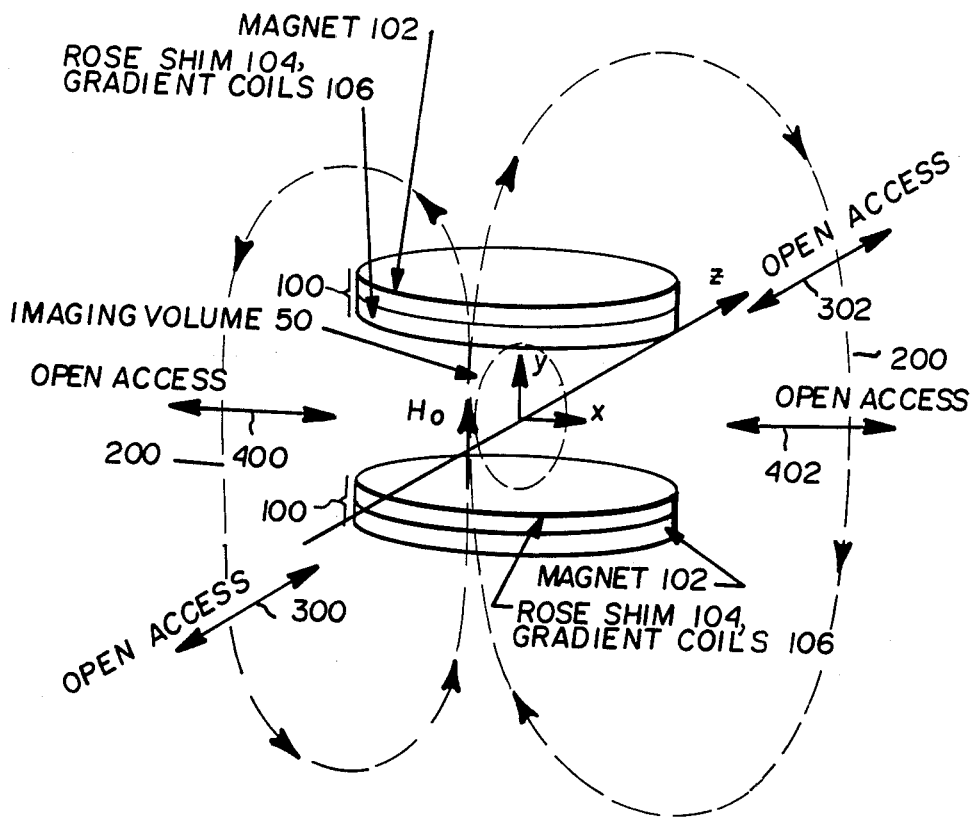
FIG. 4 is schematic drawing depicting the presently preferred exemplary embodiment of this invention wherein open access to the imaging volume is provided in four different directions, all perpendicular to the static magnetic field $H_o$ and two of which are also perpendicular to the patient transport axis.
Figure 6:
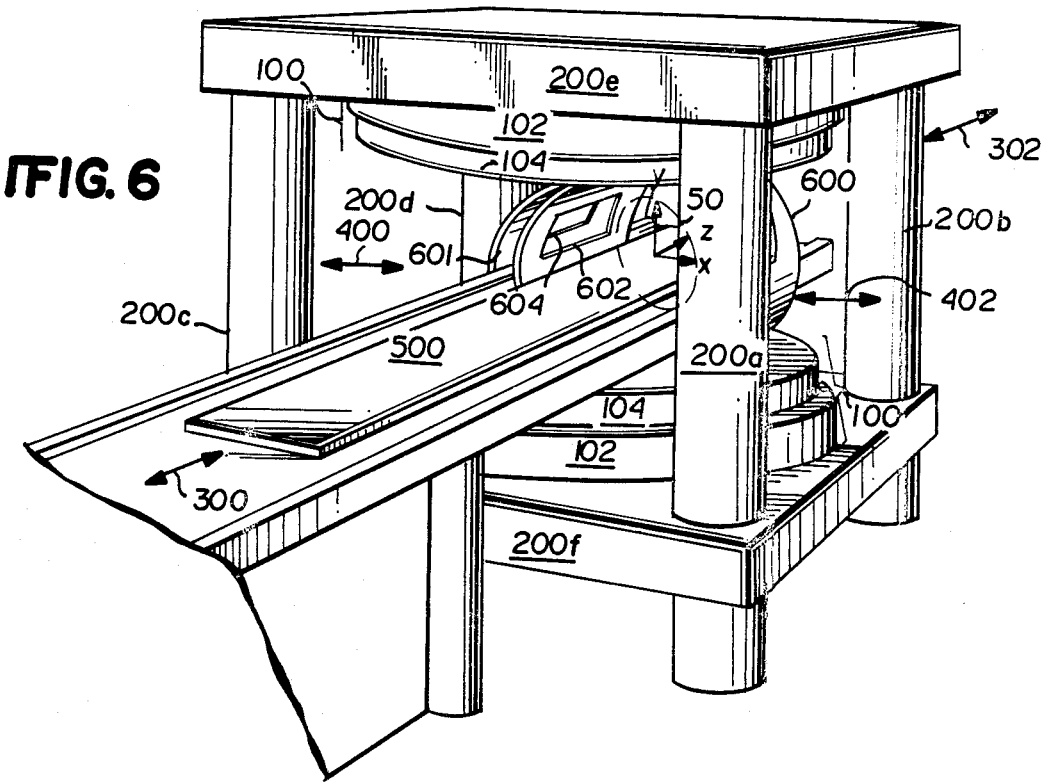
Figure 7:
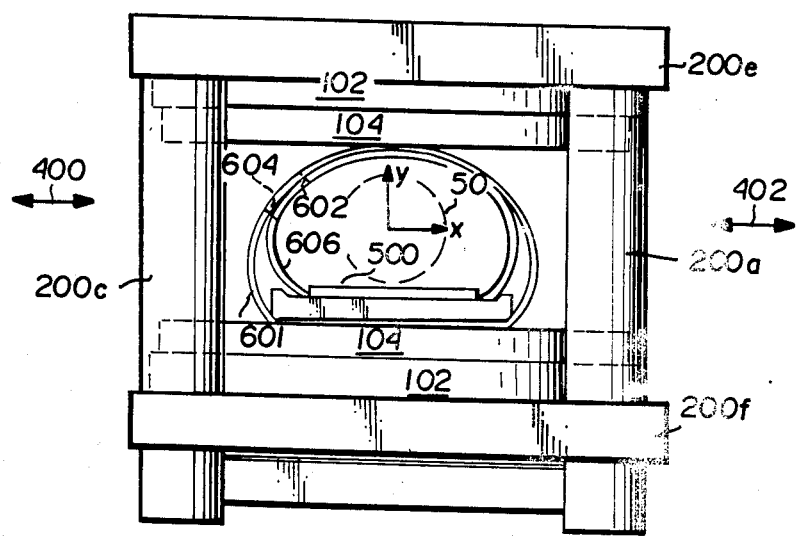
Figure 8:
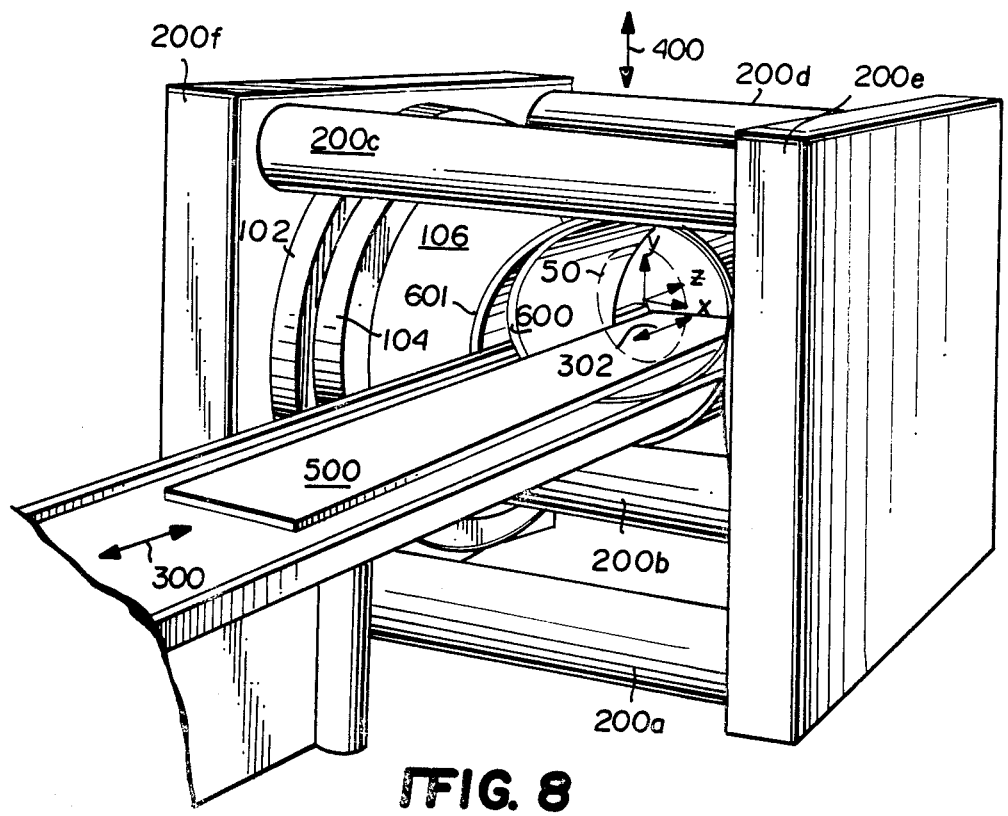
Figure 9:
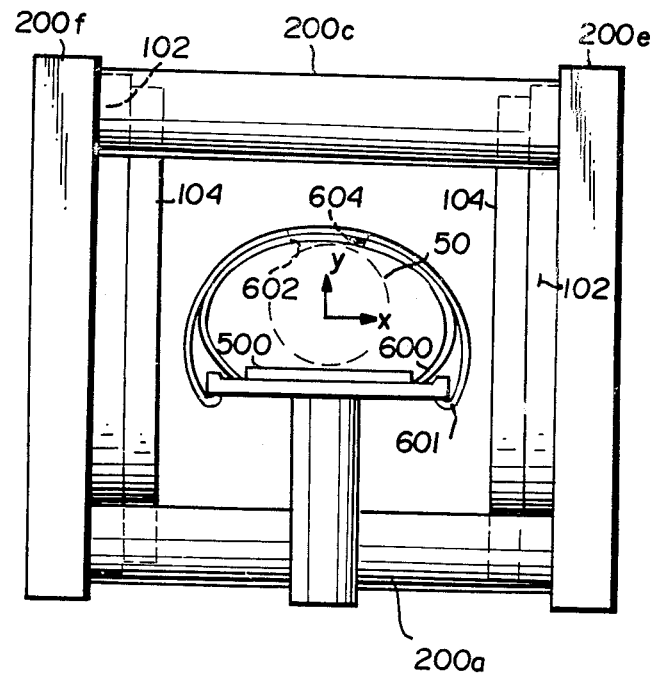

FIGS. 6 and 7, respectively, provide a perspective and an end view of a preferred exemplary embodiment of the apparatus schematically depicted in FIG. 4 and employing four vertical columns for return magnetic flux; and FIGS. 8 and 9 depict a further exemplary embodiment wherein the permanent magnets are rotated by 90° with respect to the embodiment of FIGS. 6-7 thus leaving open transverse access to the imaging volume from the top only (assuming that the bottom portion of the structure rests upon a floor support or the like).

As will be appreciated throughout the following discussion, the denomination of specific axes as being x,y, or z axes is purely a matter of convention adopted to facilitate description of relative directions and dimensions in one exemplary embodiment. Other definitions may alternatively be used for descriptive purposes.

As depicted in FIG. 4, the imaging volume 50 is sandwiched between upper and lower magnetic field producing assemblies 100. Within the imaging volume 50 (e.g., a 30 cm diameter spherical volume), cooperating permanent magnets 102 create a substantially homogenous static magnetic field $H_o$ (e.g., 650 Gauss±100 ppm with a gap width between magnet poles of approximately 60 cm and a magnet pole diameter of approximately 1300 mm). Conventional "Rose" shims 104 may be used to help insure sufficient field uniformity within the imaging volume 50.

The permanent magnets 102 and Rose shims 104 are of conventional design using conventional ferrite materials with iron or steel pole tips. For example, suitable such permanent magnets (with shims) are available from Sumitomo Special Metals Company Ltd., Osaka, Japan.

Figure 5:
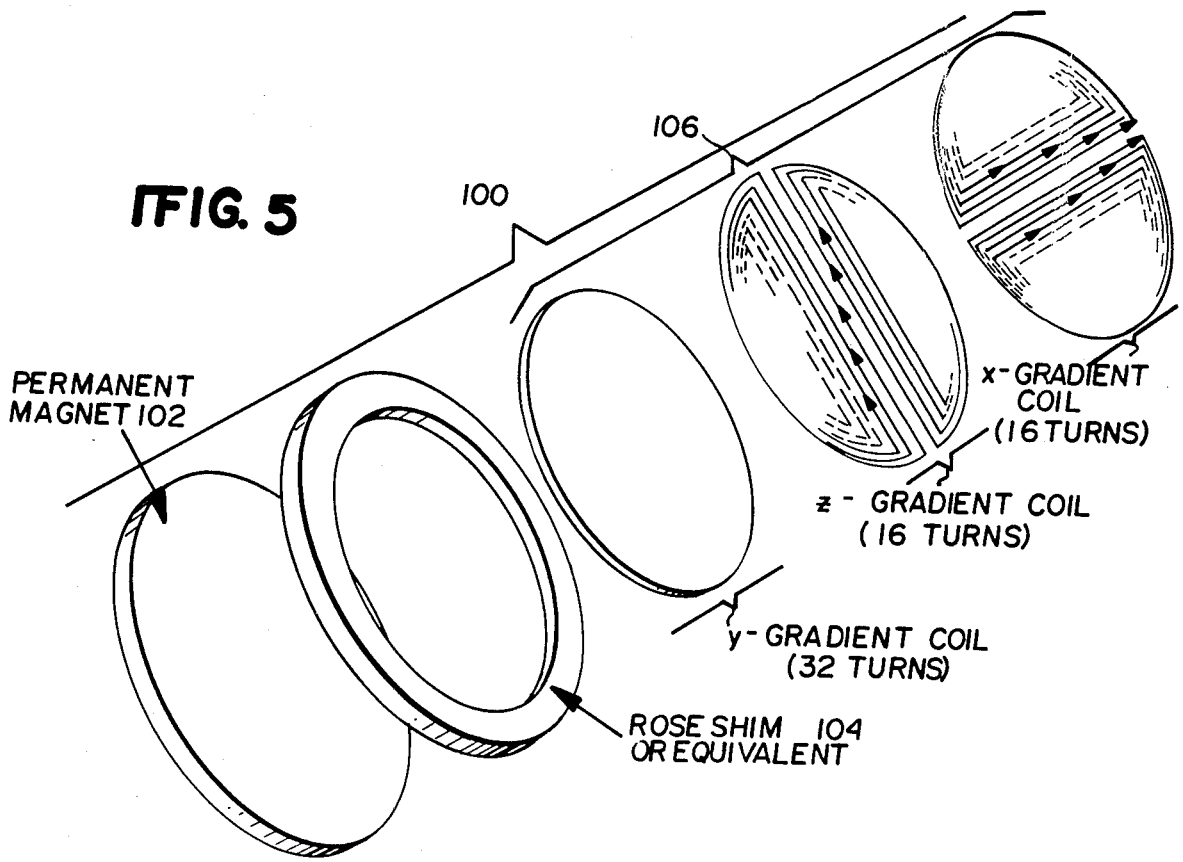
FIG. 5 is an exploded perspective view of a typical permanent magnet, shim and gradient coil structure disposed both above and below the imaging volume in the exemplary embodiment of FIG. 4.

An exploded view of the assembly 100 comprising permanent magnet 102, Rose shim 104 and gradient coils 106 is shown in FIG. 5. The gradient coil structures may also be of conventional design. In general, the y-gradient coil comprises circular loops while the x and z-gradient coils comprise respectively orthogonal sets of back-to-back D-shaped coils arranged so that current in the parallel straight conductor segments within each set passes in the same direction. In the exemplary embodiment, the individual coil windings are formed from approximately 0.1 inch square copper wire with the active straight portion of the turns being spaced apart from one another by approximately one conductor width.

In the exemplary embodiment, the gradient coils 106 are sandwiched together as closely as possible (with suitable allowances for insulating fiberglass/epoxy tape and potting materials) and fitted within the annular Rose shim 104. Thus, the gradient coils 106 are substantially parallel to the face of permanent magnet 102 and the composite magnetic field producing structure 100 is an essentially "flat" or "pancake" type of structure.

As those in the art will appreciate, the gradient coils 106 as well as suitable RF coils are connected to suitable electrical driving, RF transmitting and RF receiving circuits (not shown) so as to complete an NMR imaging system.

As those in the art will also appreciate, suitable magnetic circuits 200 must be provided for return flux between the permanent magnets 102 located outside the imaging volume 50. In the preferred exemplary embodiment, such return paths are located so as to leave open access along opposing patient transport ports 300 and 302 while simultaneously also leaving transverse open patient access ports 400 and 402 communicating directly and without obstruction to the imaging volume 50 along directions perpendicular to the patient transport axis-z.

In the exemplary embodiment of FIGS. 6-7, the magnetic flux return circuit 200 comprises flux conductive (e.g., iron or steel) members 200a, 200b, 200c, 200d, 200e, and 200f). As will be appreciated, the vertical cylindrical columns 200a-200d suffice to concentrate most of the return flux between upper and lower members 200e and 200f outside the imaging volume 50 (which is disposed between the magnetic field producing structures 100 near the center of the apparatus). A suitable patient transport structure 500 may be utilized for transporting a patient into and out of the imaging volume through open access ports 300 and 302 parallel to the z-axis (as in the conventional systems of FIGS. 1-3). However, in addition, the embodiment of FIGS. 6-7 provides transverse open access ports 400 and 402 directly into the imaging volume.

Accordingly, as a patient passes into the imaging volume, an essentially open and substantially unobstructed feeling is encountered so as to suppress or minimize possible claustrophobic reactions. Furthermore, doctors, technicians, nurses and/or MRI system operating personnel have ready access to the imaging volume for the purpose of attending to patient needs and/or adjusting RF coils 600, 601 with respect to the patient and/or imaging volume.

Although some sort of RF coil structures 600, 601 will also have to be present in the vicinity of the patient imaging volume, such structures may take the form of surface coils or may include suitable access ports 602, 604 (or maybe made so as to be at least partially transparent in selected areas) or may be of very narrow dimensions in the z-axis direction.

Although the basic structure of the magnets 102 and return flux structures 200a–200f may be conventional in and of themselves (e.g., as available from Sumitomo Special Metals Company, Ltd.), use heretofore with MRI systems has failed to utilize the potential for transverse open access areas as in the embodiment of FIGS. 6–7. Instead, prior approaches have used additional magnetic flux return circuit components and/or other types of magnetic gradient coil structures and/or other types of external housings so as to effectively obstruct access to the imaging volume 50 except along a narrow patient transport tunnel.

Another exemplary embodiment is depicted in FIGS. 8–9. It is essentially similar to that of FIGS. 6–7 except that the structure is rotated by 90° so that the static magnetic field $H_o$ is oriented in a horizontal direction rather than vertically. And, as a further consequence of such rotation, the transverse open access port 400 is also now disposed vertically with respect to the patient transport axis-z. In some circumstances, this orientation of an open access port may be preferred since the patient will typically view an unobstructed area as he/she passes face up into the imaging volume along the patient transport axis-z.

Although body coil structures 600 and 601 are depicted for illustration purposes in FIGS. 6–9, other types of RF coil structures (e.g., head coils, surface coils, etc.) may be used in addition or alternatively depending upon the MRI imaging procedure to be employed. Furthermore, such RF coil structures may be constructed so as to have narrow z-axis dimensions and/or to be partially transparent and/or to have limited access ports therethrough if desired. Even if no such access ports are provided, a substantially more open presentation is made to the patient (thus minimizing possible claustrophobic reactions) and substantially greater access is provided (e.g., so as to adjust the RF coils if for no other purpose) to operating personnel.

Although only a few exemplary embodiments of this invention have been described in detail, those skilled in the art will recognize that many variations and modifications may be made in these exemplary embodiments while yet maintaining many of the novel features and advantages of this invention. Accordingly, all such variations and modifications are intended to be included within the scope of the appended claims.

What is claimed is:

1. Magnetic resonance imaging apparatus comprising:
   main static magnetic field means for producing a static magnetic field $H_o$ within a predetermined patient imaging volume;
   patient transport means for transporting a patient into said imaging volume along a predetermined z-axis; and
   magnetic gradient coil means associated with said main static magnetic field means for effecting controlled gradients in said $H_o$ field along mutually orthogonal axes within said patient imaging volume;
   said main static magnetic field means and said gradient coil means being configured to leave an open and unobstructed patient access area communicating directly with said imaging volume along a direction perpendicular to said z-axis.

2. Magnetic resonance imaging apparatus as in claim 1 including two of said open and unobstructed patient access areas perpendicular to said z-axis.

3. Magnetic resonance imaging apparatus comprising:
   main static magnetic field means for producing a static magnetic field $H_o$ within a predetermined patient imaging volume; and
   magnetic gradient coil means associated with said main static magnetic field means for effecting controlled gradients in said $H_o$ field along mutually orthogonal axes within said patient imaging volume;
   said main field producing means and said gradient coil means being configured to leave at least three separated, open and unobstructed patient access areas communicating directly with said imaging volume along respective directions perpendicular to said $H_o$ field.

4. Magnetic resonance imaging apparatus as in claim 3 including four of said open and unobstructed patient access areas.

5. Magnetic resonance imaging apparatus as in claim 4 wherein said $H_o$ field is directed vertically and said patient access areas communicate with said imaging volume horizontally.

6. Magnetic resonance imaging apparatus as in claim 3 wherein said $H_o$ field is directed horizontally, wherein two of said patient access areas communicate with said imaging volume horizontally and wherein a third patient access area communicates with said imaging volume vertically from above said apparatus.

7. Magnetic resonance imaging apparatus comprising:
   a pair of magnetic pole pieces opposingly disposed about a patient imaging volume located therebetween so as to produce a predetermined approximately homogeneous static magnetic field directed between said pole pieces parallel to a predetermined y-axis;
   patient transport means for transporting at least a portion of a patient along a predetermined z-axis into said imaging volume, said z-axis being substantially perpendicular to said y-axis;
   magnetic return circuit means for conducting return magnetic flux from one said pole piece to the other and located outside said imaging volume; and
   a plurality of magnetic gradient coils disposed substantially parallel to said pole pieces for producing controlled gradients in said static magnetic field in directions parallel to said y and z axes and to a predetermined x-axis, which x-axis is mutually orthogonal to said y and z axes;
   said magnetic return circuit means and said gradient coils being configured to leave open and unobstructed at least three patient access areas:
   (a) first and second patient access areas respectively leading into and out of opposite sides of said imaging volume along said z-axis for patient transport therealong; and
   (b) a third patient access area communicating directly with said imaging volume along a direction perpendicular to said z-axis.

8. Magnetic resonance imaging apparatus as in claim 7 wherein:
   said third patient access area is directed vertically and parallel to said x-axis.

9. Magnetic resonance imaging apparatus as in claim 7 wherein:

said third patient access area is directed horizontally and parallel to said x-axis.

10. Magnetic resonance imaging apparatus as in claim 9 wherein:
said magnetic return circuit means and said gradient coils are configured to leave open and unobstructed a fourth patient access area opposite said third patient access area and also communicating directly with said imaging volume along a horizontal direction parallel to said x-axis.

11. Magnetic resonance imaging apparatus as in claim 7 wherein:
said magnetic return circuit means includes four cylindrical vertically disposed columns which support a first one of pole pieces in a horizontal plane above the other pole piece while also conducting said return magnetic flux and providing four open and unobstructed patient access areas therebetween directed horizontally and perpendicular to said y-axis.

12. Magnetic resonance imaging apparatus comprising:
a first magnetic pole piece disposed on a first side of a patient image area;
a second magnetic pole piece disposed on a second side of the patient image area opposite said first side;
at least three magnetic circuit members interconnecting corresponding peripheral portions of said pole pieces and defining at least three open access ports therebetween into said patient image area;
magnetic gradient coil means disposed adjacent said pole pieces on either side of said patient image area while leaving said open access ports substantially unobstructed; and
patient support means for transporting a patient through one of said open access ports into said patient image area while leaving the remaining ports with open access whereby patient claustrophobic reactions are reduced while also facilitating ready access to the patient image area.

13. Magnetic resonance imaging apparatus as in claim 12 wherein:
each said pole piece has a circular end face disposed in a generally horizontal plane and directed toward said patient image area; and
said magnetic circuit members include four cylindrical support members disposed vertically so as to support said first pole piece above said second pole piece while also providing a return magnetic circuit therebetween.

14. Magnetic resonance imaging apparatus as in claim 13 wherein said support members are disposed at approximately 90° intervals abut the periphery of said circular end faces.

15. Magnetic resonance imaging apparatus as in claim 12 wherein:
each pole piece has a circular end face disposed in a generally vertical plane and directed toward said patient image area; and
said magnetic circuit members include four cylindrical members disposed horizontally so as to provide a return magnetic circuit therebetween while leaving an open access port at each end and at the top of said patient image area.

16. Magnetic resonance imaging apparatus as in claim 15 wherein said support members are disposed at approximately 90° intervals about the periphery of said circular end faces.

* * * * *